United States Patent [19]

Umehara et al.

[11] Patent Number: 5,320,931
[45] Date of Patent: Jun. 14, 1994

[54] LIGHT-SENSITIVE COMPOSITION

[75] Inventors: Akira Umehara; Syunichi Kondo, both of Shizuoka; Tsuguo Yamaoka, Funabashi, all of Japan

[73] Assignee: Fuji Photo Film Co., Ltd., Minami-Ashigara, Japan

[21] Appl. No.: 731,272

[22] Filed: Jul. 17, 1991

[30] Foreign Application Priority Data

Jul. 23, 1990 [JP] Japan .................... 2-194147

[51] Int. Cl.$^5$ ..................... G03C 1/73; G03F 7/032
[52] U.S. Cl. .................... 430/270; 430/914; 430/920; 430/926; 430/326
[58] Field of Search ............. 430/176, 920, 926, 271, 430/281, 270, 914, 326; 522/31

[56] References Cited

U.S. PATENT DOCUMENTS

| | | | |
|---|---|---|---|
| 3,661,582 | 0/0000 | Broyde | 96/36.2 |
| 4,101,323 | 7/1978 | Buhr et al. | |
| 4,104,070 | 8/1978 | Moritz et al. | 96/36 |
| 4,168,171 | 9/1979 | Winslow et al. | 96/75 |
| 4,196,003 | 4/1980 | Watanabe et al. | 430/193 |
| 4,247,611 | 1/1981 | Sander et al. | 430/286 |
| 4,506,003 | 3/1985 | Ruckert et al. | |
| 4,618,564 | 10/1986 | Demmer et al. | 430/270 |
| 4,678,737 | 7/1987 | Schneller et al. | 430/270 |
| 4,721,665 | 1/1988 | Dooley et al. | 430/169 |
| 4,810,613 | 3/1989 | Osuch et al. | 430/192 |
| 5,070,001 | 12/1991 | Stahlhofen | 430/281 |
| 5,110,709 | 5/1992 | Aoai et al. | 430/271 |
| 5,118,582 | 6/1992 | Ueno et al. | 430/270 |

FOREIGN PATENT DOCUMENTS

| | | |
|---|---|---|
| 211350 | 2/1987 | European Pat. Off. |
| 0249139 | 12/1987 | European Pat. Off. |
| 0424124 | 4/1991 | European Pat. Off. |
| 4124426 | 1/1992 | Fed. Rep. of Germany |
| 5636648 | 9/1979 | Japan |

OTHER PUBLICATIONS

MacDonald, S. A. et al, IBM Research Disclosure, 1982 pp. 114–117.

Primary Examiner—Marion E. McCamish
Assistant Examiner—Rosemary Ashton
Attorney, Agent, or Firm—Burns, Doane, Swecker & Mathis

[57] ABSTRACT

A positive working light-sensitive composition comprising (a) a compound capable of generating acids through irradiation of actinic rays or radiant rays, (b) an organic base and (c) an alkali-soluble polymer. The composition is highly sensitive to light in wider wavelength region and highly resistant to aging. It can easily be produced and can hence be easily available.

9 Claims, No Drawings

LIGHT-SENSITIVE COMPOSITION

BACKGROUND OF THE INVENTION

The present invention relates to a positive working light-sensitive composition which makes it possible to form a presensitized plate for use in making a lithographic printing plate (hereunder referred to as "PS plate"), proof sheets for process printing, figures for overhead projectors or fine resist patterns required for making integrated circuits (IC) of semiconductor elements.

As so-called positive working light-sensitive materials which are made soluble by irradiating with actinic rays, for instance, in making lithographic printing plates, there have been known o-quinonediazide compounds and these compounds have practically been utilized widely for preparing PS plates or the like. Such o-quinonediazide compounds are disclosed in various publications inclusive of U.S. Pat. Nos. 2,766,118; 2,767,092; 2,772,972; 2,859,112; 2,907,665; 3,046,110; 3,046,111; 3,046,115; 3,046,118; 3,046,119; 3,046,120; 3,046,121; 3,046,122; 3,046,123; 3,061,430; 3,102,809; 3,106,465; 3,635,709; and 3,647,443.

These o-quinonediazide compounds are decomposed by irradiation with actinic rays to form 5-membered carboxylic acids and they are thus made alkali-soluble. In these applications of the light-sensitive material, such properties of the compounds are utilised. However, their light-sensitivity is insufficient. This problem arises because it is difficult to optically sensitize the o-quinonediazide compounds and their quantum yield essentially never exceeds 1. Further, light wavelength for exposure is fixed and light sources are limited. It is difficult to impart safety under white light. In addition, the absorption of light in Deep-UV region is great and thus it is not suitable for applications in which light of short wave length is used to enhance the resolution of a photoresist.

Many attempts have been made to improve the light-sensitivity of light-sensitive compositions containing o-quinonediazide compounds. For instance, examples of such attempts are disclosed in Japanese Patent Publication for Opposition Purpose (hereunder referred to as "J.P. KOKOKU") No. Sho 48-12242, Japanese Patent Un-examined Publication (hereunder referred to as "J.P. KOKAI") No. Sho 52-40125 and U.S. Pat. No. 4,307,173.

Recently, there have been proposed some positive working light-sensitive compositions free of o-quinonediazide compounds. One example thereof comprises a polymeric compound having o-nitrocarbinol ester groups as disclosed in J.P. KOKOKU No. Sho 56-2696. However, such a composition does not provide high sensitivity for the same reasons as those discussed above in connection with o-quinonediazide compounds.

On the other hand, as pattern-forming methods used in making electronic parts such as semiconductor elements, magnetic bubble memories and integrated circuits, there have been widely employed methods in which photoresists sensitive to ultraviolet and visible rays are used. The photoresists are classified into two groups, one of which is negative working type ones whose exposed portions are made insoluble in a developer by irradiating with light, and the other of which is positive working ones whose exposed portions are, on the contrary, made soluble in a developer. The negative working type ones are superior in sensitivity to the positive working ones and adhesion to a substrate and resistance to chemicals required in wet etching are also excellent. Therefore, the use of negative working resists is one of the mainstreams of photolithography. However, the line width and the distance between lines of patterns become smaller as the degree of integration of semiconductor elements and the packaging density thereof are increased. In addition, dry etching techniques have been adopted as a means for etching substrates. Thus, the photoresists should have high resolution and high resistance to dry etching. For this reason, positive working photoresists are mainly utilized recently. In particular, there have been exclusively used alkali developable positive working photoresists mainly composed of alkali-soluble novolak resins as disclosed in J. C. Strieter, Kodak Microelectronics Seminar Proceedings, 1976, p. 116, since they are excellent in sensitivity, resolution and resistance to dry etching.

However, it is required to make much smaller size of patterns to thus achieve much higher packaging density and degree of integration accompanied by the recent increase in multifunctionality and high functionality of electronic devices.

Under such circumstances, there have been proposed light-sensitive compositions comprising a combination of a conventional o-quinonediazide light-sensitive material and a silicone polymer such as polysiloxane or polysilmethylene which is made alkali-soluble, for instance, those disclosed in J. P. KOKAI Nos. Sho 61-256347, Sho 61-144639, Sho 62-159141, Sho 62-191849, Sho 62-220949, Sho 62-229136, Sho 63-90534 and Sho 63-91654. Further, a light-sensitive composition comprising a combination of a polysiloxane/carbonate block copolymer and an effective amount of an onium salt is disclosed in J. P. KOKAI No. Sho 62-136638. However, it is very difficult to produce these polymers owing to the operation of making them alkali-soluble. Further, the resistance to aging of these polymers is not sufficient.

SUMMARY OF THE INVENTION

Accordingly, an object of the present invention is to provide a novel positive working light-sensitive composition without the foregoing disadvantages, more specifically to provide a novel positive working light-sensitive composition being highly sensitive to light in wider wavelength region.

Another object of the present invention is to provide a novel positive working light-sensitive composition which can easily be produced and can hence be easily available.

A further object of the present invention is to provide a novel positive working light-sensitive composition which has a high resistance to aging.

The inventors of this invention have conducted various studies to achieve the foregoing objects and have found that a composition having an organic base and a compound generating acids through irradiation of actinic rays and radiant rays such as onium salt in an alkali-soluble polymer such as cresol resin can produce clear positive images, and completed the present invention.

The present invention provides a novel positive working light-sensitive composition compsiring (a) a compound capable of generating acids through irradiation of actinic rays or radiant rays, (b) an organic base and (c) an alkali-soluble polymer.

Up to now, the reason why clear positive images are produced has not known. It can be, however, estimated that in unexposure range, said compound generating acids or said organic base interacts something with said alkali-soluble polymer thus to decrease solubility of light-sensitive layer in alkaline developer; on the other hand in exposure range, said compound generating acids generates acids to form salts with said organic base thus to increase solubility of light sensitive layer in alkaline developer so as to produce a positive image.

DETAILED EXPLANATION OF THE INVENTION

The present invention will now be explained in detail.

(a) Compounds Capable of Generating Acids Through Irradiation of Actinic Rays or Radiant Rays Examples of suitable compounds which are capable of generating acids through irradiation with actinic rays or radiant rays and which can be used in the positive working light-sensitive composition of the present invention are various known compounds and mixtures thereof such as diazonium, phosphonium, sulfonium and iodonium salts of $BF_4-$, $AsF_6-$, $PF_6-$, $SbF_6-$, $SiF_6-$ and $ClO_4-$; organic halogen compounds; and combinations of organometalic compounds and organic halogen compounds. Also suitably used in the composition of the present invention are compounds capable of generating acids through photolysis as disclosed in U.S. Pat. No. 3,779,778, German Patent No. 2,610,842 and European Patent No. 126,712.

Typical examples of the foregoing compounds capable of generating acids through irradiation of actinic rays or radiant rays will hereunder be explained.

(1) Oxadiazole compounds of formula (I) or s-triazine compounds of (II) having a trihalomethyl group:

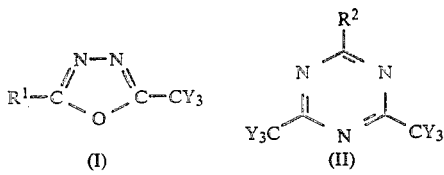

In the formulas, $R^1$ represents a substituted or unsubstituted aryl group or a substituted or unsubstituted alkenyl group; $R^2$ represents a substituted or unsubstituted aryl group, a substituted or unsubstituted alkenyl group, $-CY_3$ or a substituted or unsubstituted alkyl group; and Y represents a chlorine atom or a bromine atom.

Specific examples thereof are those listed below:

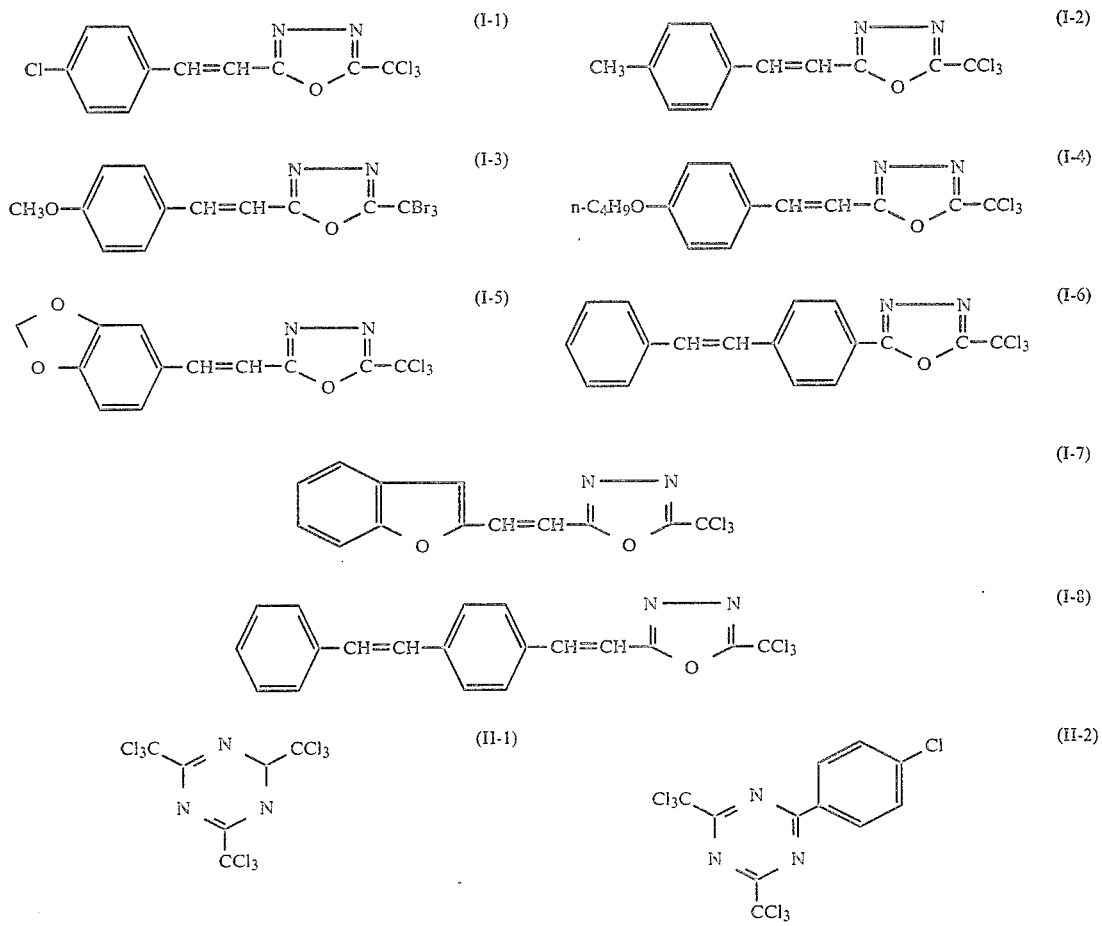

-continued

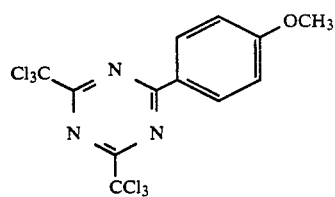 (II-3)

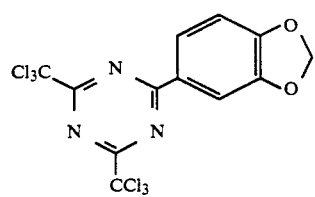 (II-4)

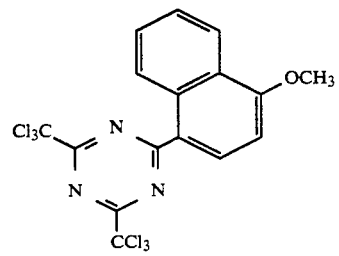 (II-5)

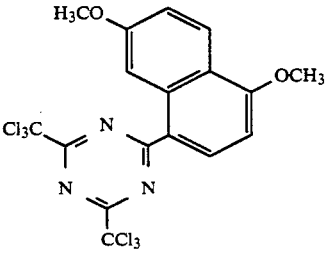 (II-6)

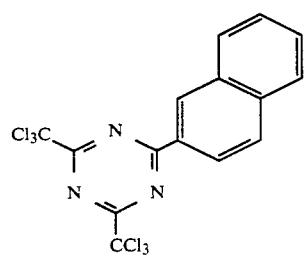 (II-7)

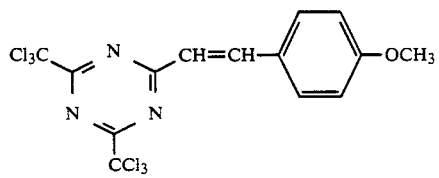 (II-8)

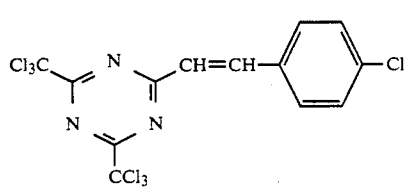 (II-9)

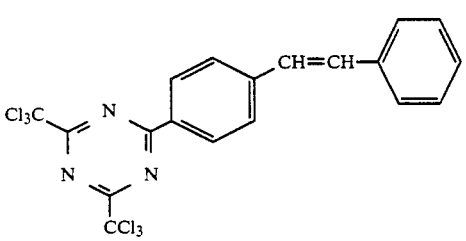 (II-10)

(2) Iodonium salts of formula (III) or sulfonium salts of formula (IV):

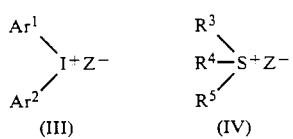

In these formulas, $Ar^1$ and $Ar^2$ may be same or different and each represents a substituted or unsubstituted aryl group. Examples of preferred substituents or the aryl groups are alkyl, haloalkyl, cycloalkyl, alkoxy, nitro, carbonyl, alkoxycarbonyl, hydroxy and mercapto groups and halogen atoms; $R^3$, $R^4$ and $R^5$ may be same or different and each represents a substituted or unsubstituted alkyl group or a substituted or unsubstituted aryl group, preferably an aryl group having 6 to 14 carbon atoms, an alkyl group having 1 to 8 carbon atoms or a substituted derivative thereof. Examples of preferred substituents for the aryl groups are alkoxy groups having 1 to 8 carbon atoms, alkyl groups having 1 to 8 carbon atoms, nitro, carbonyl and hydroxyl groups and halogen atoms and those for the alkyl groups are alkoxy groups having 1 to 8 carbon atoms, carbonyl group and alkoxycarbonyl groups. $Z-$ represents $BF_4-$, $AsF_6-$, $PF_6-$, $SbF_6-$, $SiF_6-$, $ClO_4-$, $CF_3SO_3-$. Moreover, two of the groups $R^3$, $R^4$ and $R^5$, and $Ar^1$ and $Ar^2$ each may be bonded through a single bond or a substituent.

Examples of the compounds represented by formula (III) are those disclosed in J. P. KOKAI Nos. Sho 50-158680 and Sho 51-100716 and J. P. KOKOKU No. Sho 52-14277. Specific examples thereof are as follows:

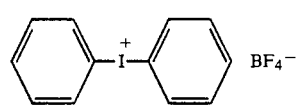 (III-1)

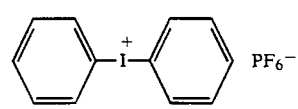 (III-2)

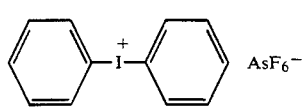 (III-3)

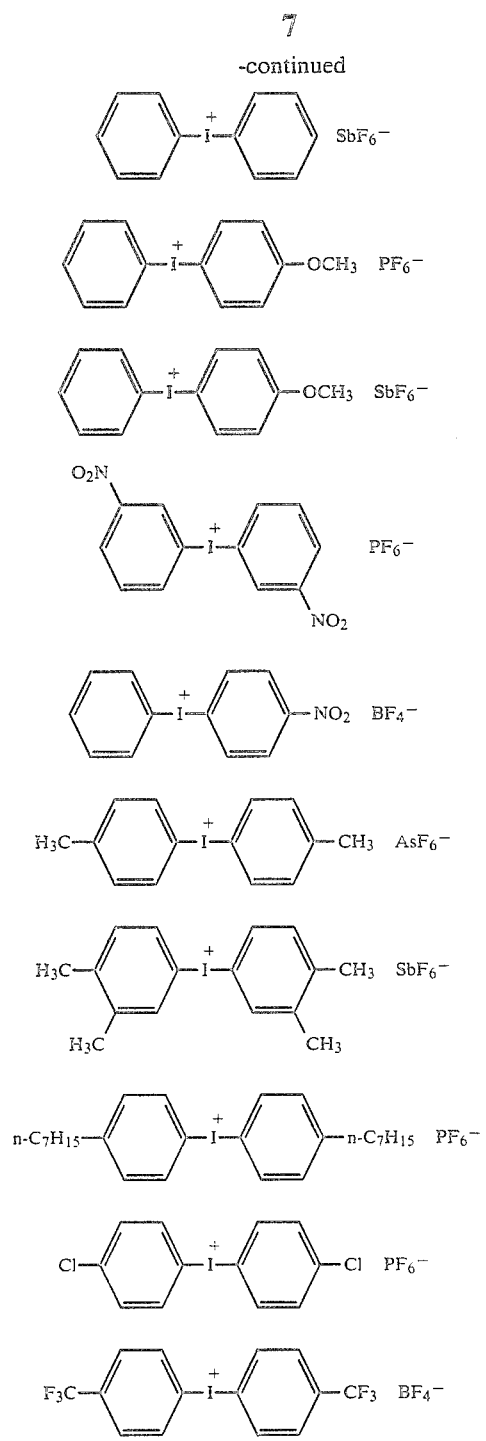
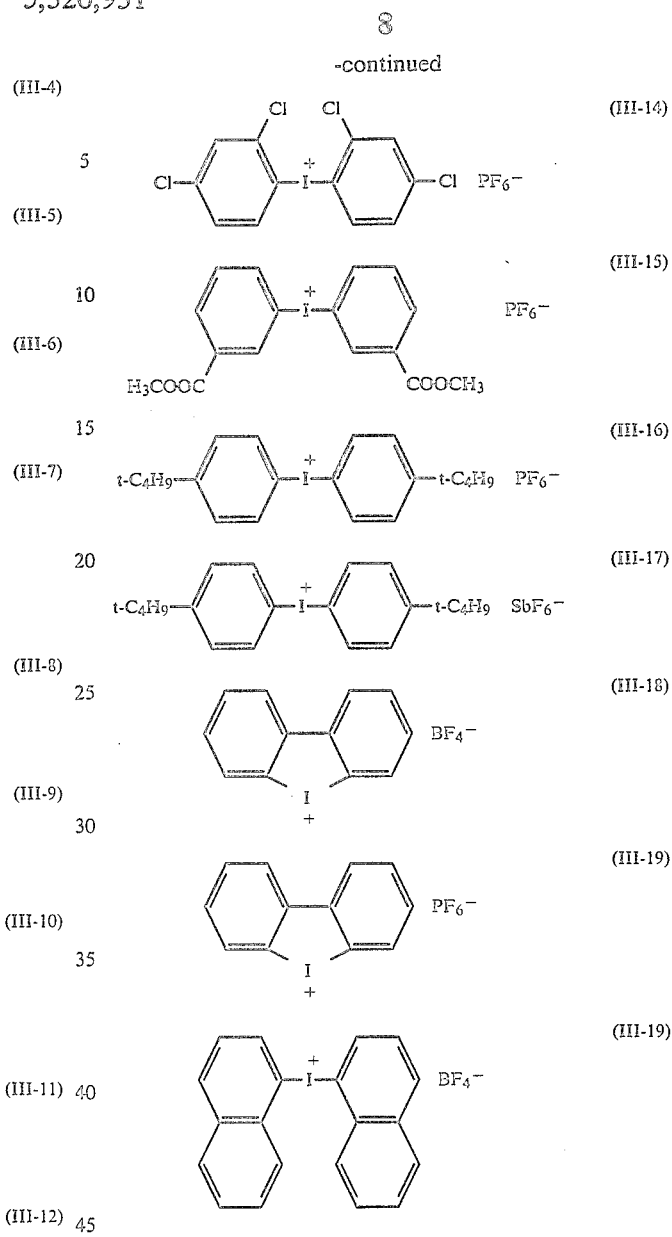
Examples of the compounds represented by formula (IV) are those disclosed in J. P. KOKAI No. Sho 51-56885, J. P. KOKOKU No. Sho 52-14278, U.S. Pat. No. 4,442,197 and German Patent No. 2,904,626. Specific examples thereof are listed below:
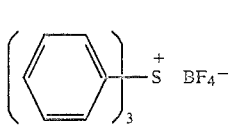
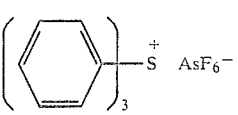
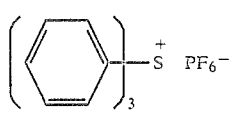
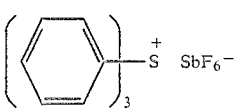

(IV-5) 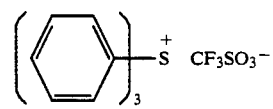
(IV-6) 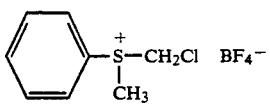
(IV-7) 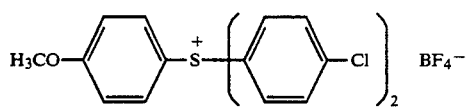
(IV-8) 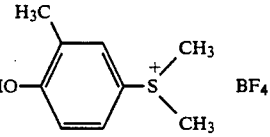
(IV-9) 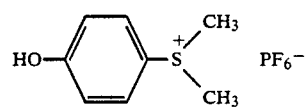
(IV-10) 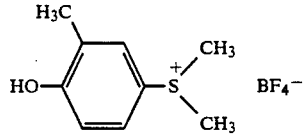
(IV-11) 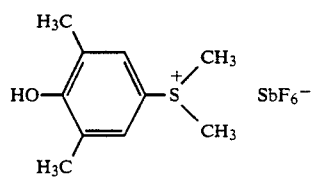
(IV-12) 
(IV-13) 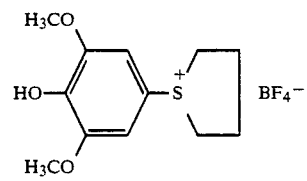
(IV-14) 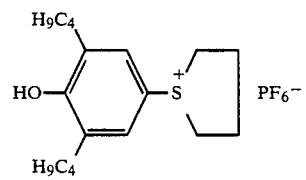
(IV-15) 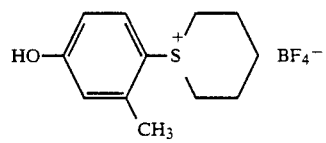
(IV-16) 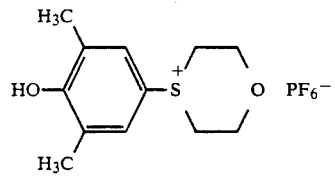
(IV-17) 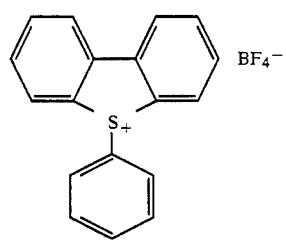
(IV-18) 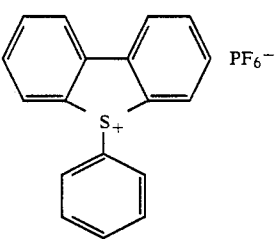
(IV-19) 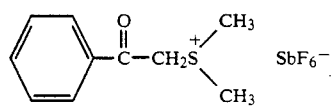
(IV-20) 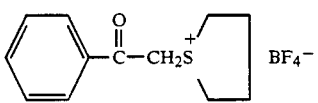
(IV-21) 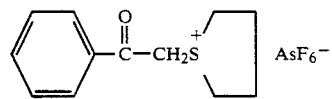
(IV-22) 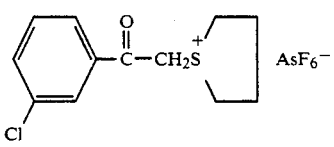
(IV-23) 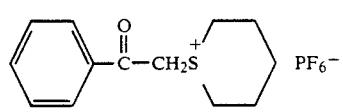
(IV-24) 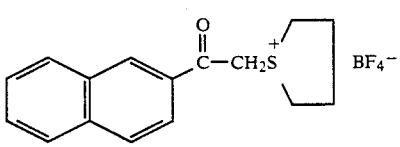

-continued

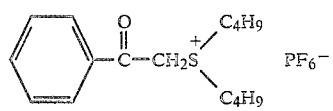 (IV-25)

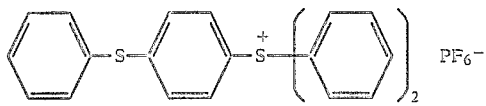 (IV-26)

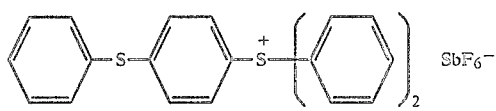 (IV-27)

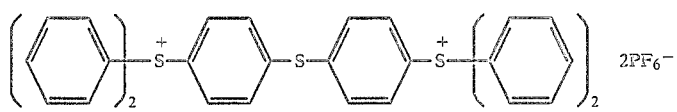 (IV-28)

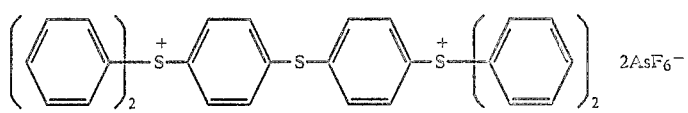 (IV-29)

The compounds represented by formulas (III) and (IV) are known and can be prepared, for instance, according to the procedures disclosed in J. W. Knapczyk et al., J. Am. Chem. Soc., 1969, 91, p. 145; A. L. Maycock et al., J. Org. Chem., 1970, 35, p. 2532; E. Goethals et al., Bull. Soc. Chem. Belg., 1964, 73, p. 546; H. M. Leicester, J. Am. Chem. Soc., 1929, 51, p. 3587; J. V. Crivello et al., J. Polym. Sci. Polym. Chem. Ed., 1980, 18, p. 2677; U.S. Pat. Nos. 2,807,648 and 4,247,473; F. M. Beringer et al., J. Am. Chem. Soc., 1953, 75, p. 2705; and J. P. KOKAI No. Sho 53-101331.

(3) Disulfone derivatives of formula (V) or imidosulfonate derivatives of formula (VI):

$$Ar^3-SO_2-SO_2-Ar^4 \quad (V)$$

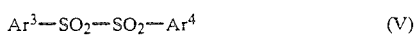 (VI)

In the formulas, $Ar^3$ and $Ar^4$ may be same or different and each represents a substituted or unsubstituted aryl group; $R^6$ represents a substituted or unsubstituted alkyl group or a substituted or unsubstituted aryl group and A represents a substituted or unsubstituted alkylene, alkenylene or arylene group.

Specific examples thereof are as follows:

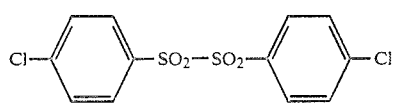 (V-1)

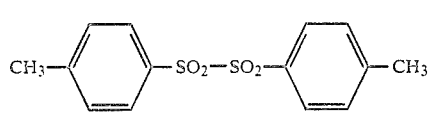 (V-2)

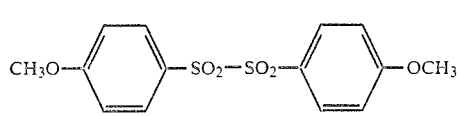 (V-3)

-continued

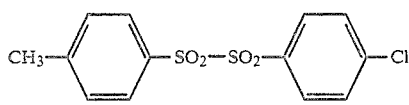 (V-4)

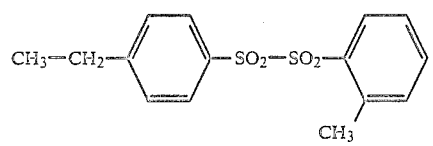 (V-5)

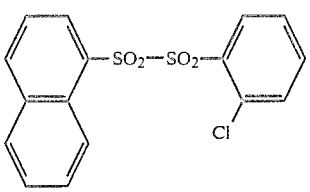 (V-6)

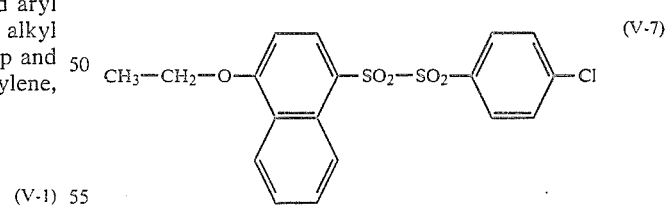 (V-7)

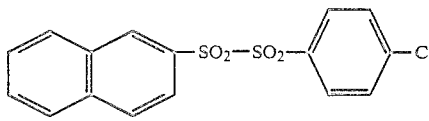 (V-8)

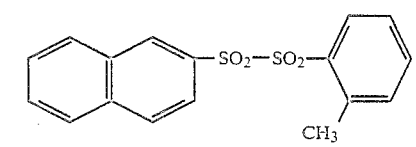 (V-9)

An amount of these compounds capable of generating acids through irradiation of actinic rays or radiant rays to be added to the composition ranges from 0.001 to 40% by weight, preferably 0.1 to 20% by weight, more preferably 1 to 15% by weight based on the total weight of the solid content of the composition.

(b) Organic Base

Preferred examples of the organic base used in the present invention are compounds represented by the general formulas (VII) to (XVIII).

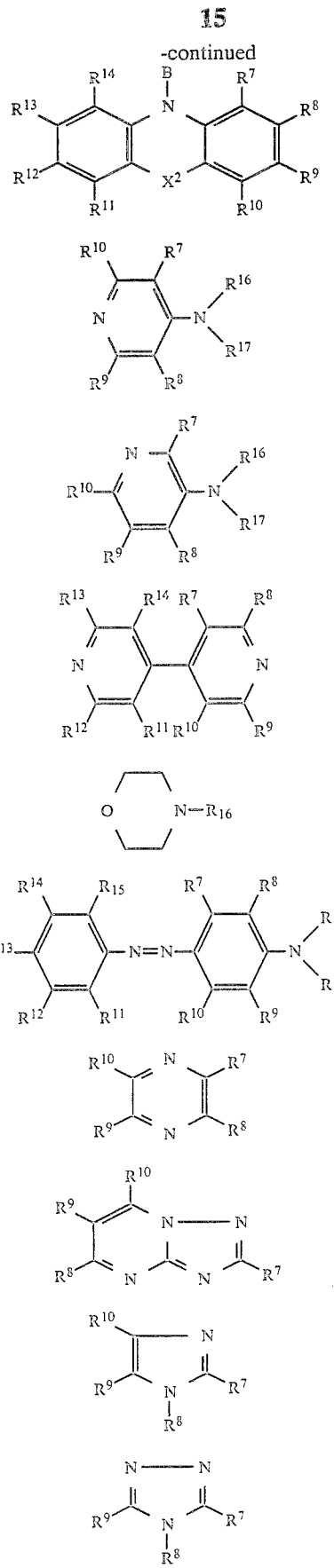

wherein $R^7$, $R^8$, $R^9$, $R^{10}$, $R^{11}$, $R^{12}$, $R^{13}$, $R^{14}$ and $R^{15}$ may be same or different and each represents a hydrogen atom, a substituted or unsubstituted alkyl group, a substituted or unsubstituted aryl group, a substituted or unsubstituted alkoxy group, a halogen atom, a nitro group, a dialkylamino group or a diarylamino group; $R^{16}$ and $R^{17}$ may be same or different and each represents a hydrogen atom, a substituted or unsubstituted alkyl group or a substituted or unsubstituted aryl group; $X^1$ is an oxygen atom or a sulfur atom; $X^2$ is an oxygen atom, a sulfur atom, =CO, or =N—$R^{18}$ wherein $R^{18}$ represents a hydrogen atom, a substituted or unsubstituted alkyl group or a substituted or unsubstituted aryl group; B is a hydrogen atom, a substituted or unsubstituted alkyl group, a substituted or unsubstituted aryl group, or a group represented by the formula;

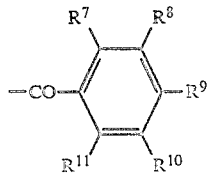

Specific examples thereof are as follows:

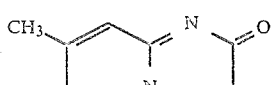
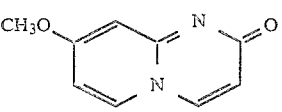
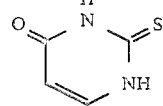
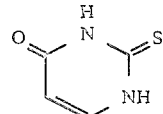
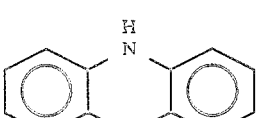
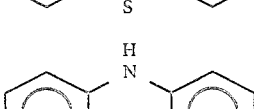

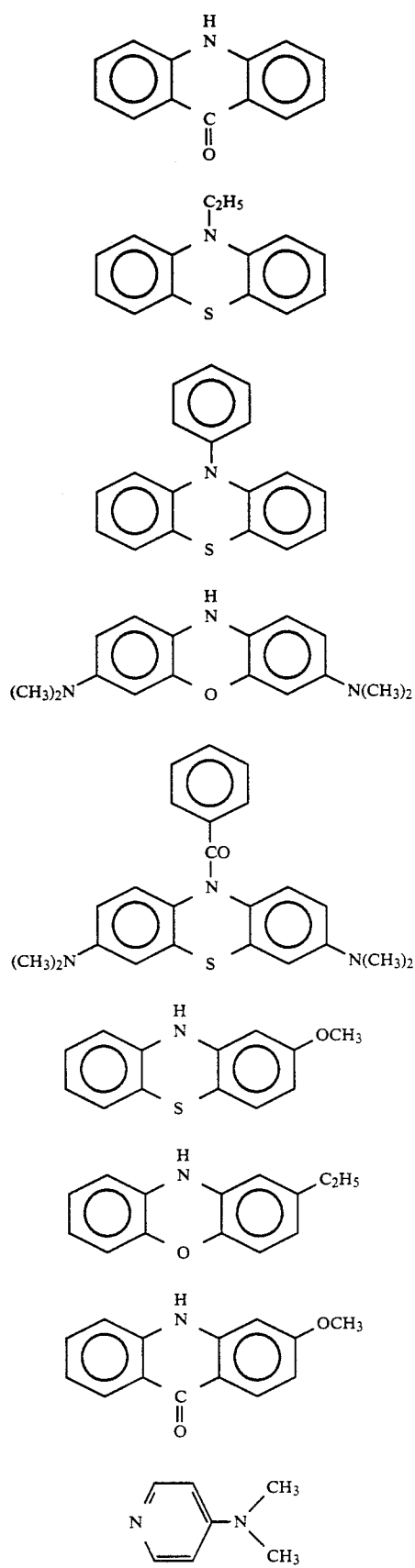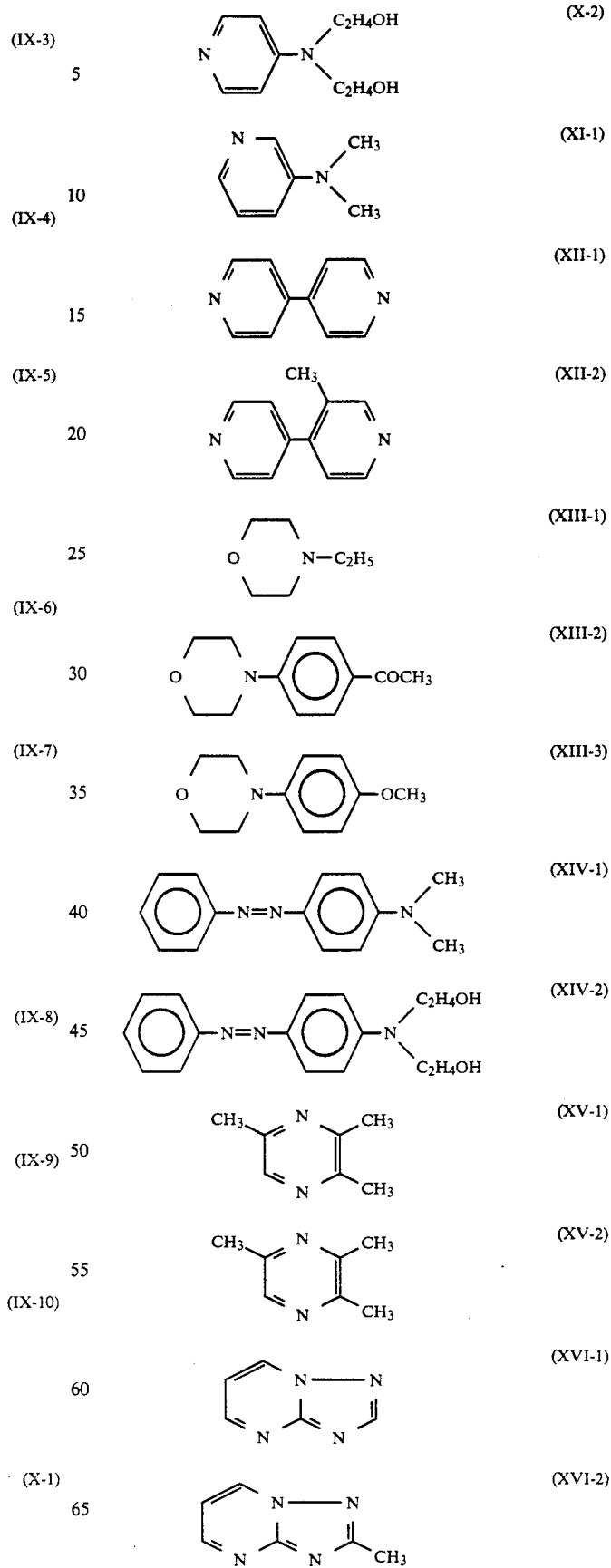

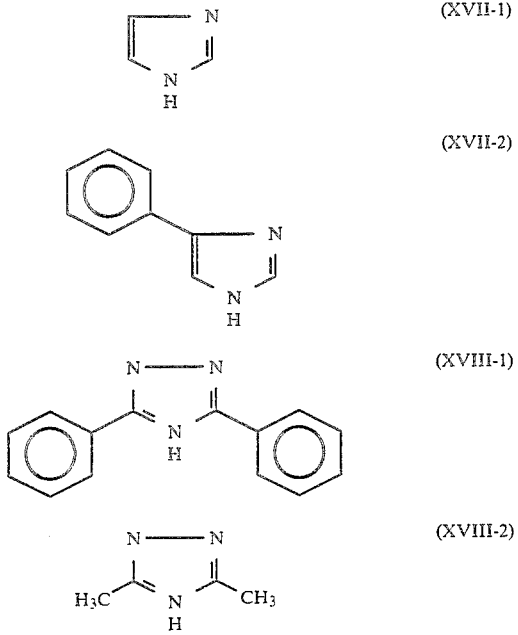

(XVII-1)
(XVII-2)
(XVIII-1)
(XVIII-2)

Further, a resin having side chains such as 2-pyridyl, 4-pyridyl or imidazole group may be used as the organic base used in the invention.

An amount of the organic base used in the composition of the present invention ranges from 0.1 to 50% by weight based on the total weight of the composition.

(c) Alkali-soluble Polymers

The alkali-soluble polymers used in the composition are polymers carrying acidic group having a pKa value of not more than 11 such as phenolic hydroxyl group, carboxyl group, sulfonate residue, imido group, sulfonamido group, N-sulfonylamido group, N-sulfonylurethane group and/or active methylene group. Preferred alkali soluble polymers are novolak type phenol resins such as phenol formaldehyde resin, o-cresol-formaldehyde resin, m-cresol-formaldehyde resin, p-cresol-formaldehyde resin, xylenol-formaldehyde resin and co-condensates thereof. It is also possible to simultaneously use the aforesaid phenol resin and a condensate of phenol or cresol substituted with an alkyl group having 3 to 8 carbon atoms with formaldehyde such as t-butylphenol/formaldehyde resin as disclosed in J. P. KOKAI No. Sho 50-125806. Examples of other polymers usable in the invention are polymers comprising phenolic hydroxyl group-containing monomer such as N-(4-hydroxyphenyl) methacrylamide as a copolymerization component; homo- or copolymers of monomer(s) such as p-hydroxystyrene, o-hydroxystyrene, m-isopropenylphenol and/or p-isopropenylphenol and partially etherified or esterified products thereof.

Further, polymers comprising a carboxyl group-containing monomer such as acrylic acid and methacrylic acid as a copolymerization component; carboxyl group-containing polyvinyl acetal resins as disclosed in J. P. KOKAI No. Sho 61-267042; and carboxyl group-containing polyurethane resins as disclosed in J. P. KOKAI No. Sho 63-124047 can suitably be used.

Polymers comprising repeating units derived from monomers such as N-(4-sulfamoylphenyl) methacrylamide, N-phenylsulfonyl methacrylamide and/or maleimide as copolymerization components; and active methylene group-containing polymers as disclosed in J. P. KOKAI No. Sho 63-127237 are also used in the composition of the invention.

These alkali-soluble polymers may be used alone or in combination. An amount of these alkali-soluble polymers to be incorporated into the light-sensitive composition preferably ranges from 10 to 90% by weight, more preferably 30 to 80% by weight on the basis of the total weight of the solid content of the composition.

OTHER PREFERRED COMPONENTS

The positive working light sensitive composition of the present invention may optionally comprise other additives such as dyes, pigments, plasticizers and compounds for enhancing acid-generating efficiency of the foregoing compounds capable of generating acids through actinic rays or radiant rays (so-called sensitizers).

Such sensitizers for the acid generator represented by formulas (III) and (IV) are, for instance, compounds disclosed in U.S. Pat. Nos. 4,250,053 and 4,442,197. Specific examples thereof are anthracene, phenanthrene, perylene, pyrene, chrysene, 1,2-benzanthracene, coronene, 1,6-diphenyl-1,3,5-hexatriene, 1,1,4,4-tetraphenyl-1,3-butadiene, 2,3,4,5-tetraphenyl furan, 2,5-diphenylthiophene, thioxanthone, 2-chlorothioxanthone, phenothiazine, 1,3-diphenyl pyrazoline, 1,3-diphenyl isobenzofuran, xanthone, benzophenone, 4-hydroxybenzophenone, anthrone, ninhydrin, 9-fluorenone, 2,4,7-trinitrofluorenone, indanone, phenanthraquinone, tetralone, 7-methoxy-4-methylcoumalin, 3-keto-bis(7-di ethylaminocoumalin), Michler's ketone and ethyl Michler's ketone.

Molar ratio of these sensitizers to the compound capable of generating an acid upon photolysis ranges from 0.01/1 to 20/1 and preferably 0.1/1 to 5/1.

In addition, dyes may be used as a coloring agent and preferred dyes include, for instance, oil-soluble dyes and basic dyes. Specific examples thereof are Oil Yellow #101, Oil Yellow #130, Oil Pink #312, Oil Green BG, Oil Blue BOS, Oil Blue #603, Oil Black BY, Oil Black BS, Oil Black T-505 (these dyes being available from ORIENT CHEMICAL INDUSTRIES, LTD.), Crystal violet (CI 42555), Methyl Violet (CI 42535), Rhodamine B (CI 45170 B), Malachite Green (CI 42000) and Methylene Blue (CI 52015).

The light-sensitive composition of the present invention may further comprise cyclic acid anhydrides and other fillers for further enhancing the sensitivity thereof. Examples of cyclic acid anhydrides are, as disclosed in U.S. Pat. No. 4,115,128, phthalic anhydride, tetrahydrophthalic anhydride, hexahydrophthalic anhydride, 3,6-endoxy-tetrahydrophthalic anhydride, tetrachlorophthalic anhydride, maleic anhydride, chloromaleic anhydride, α-phenylmaleic anhydride, succinic anhydride and pyromellitic acid. The sensitivity can be increased as high as about 3 times at maximum by incorporating these cyclic acid anhydride into the composition in an amount of 1 to 15% by weight based on the total weight of the composition.

SOLVENT

The positive working light-sensitive composition of the present invention is dissolved in a solvent capable of dissolving the components of the composition and then applied onto the surface of a substrate if it is used as a material for PS plates. In addition, if it is used as a resist for processing semiconductors or the like, it is dissolved in a solvent and the solution is used as such. Examples of such solvents herein used are ethylene dichloride, cyclohexanone, methyl ethyl ketone, methanol, ethanol, propanol, ethylene glycol monomethyl ether, 1-methoxy-2-propanol, ethylene glycol monoethyl ether, 2-methoxyethyl acetate, 1-methoxy-2-propyl acetate, dimethoxyethane, methyl lactate, ethyl lactate, N,N-dimethylacetamide, N,N-dimethylformamide, tetramethyl urea, N-methylpyrrolidone, dimethylsulfoxide, sulforane, γ-butyrolactone, toluene and ethyl acetate and these solvents can be used alone or in combination.

The concentration of the foregoing components (the total solid content inclusive of additives) ranges from 2 to 50% by weight. When the solution is applied onto a substrate, the amount thereof coated varies depending on the applications and, for instance, as a rule it preferably ranges from 0.5 to 3.0 g/m² based on the solid content for PS plates. As the amount thereof coated decreases, the light-sensitivity correspondingly increases, but, on the contrary, physical properties of the resultant film are impaired.

PREPARATION OF PS PLATES OR THE LIKE

When a PS plate is prepared from the positive working light-sensitive composition of this invention, a substrate is in general used and examples thereof include paper, paper laminated with a plastic film such as polyethylene, polypropylene or polystyrene film; a metal plate such as an aluminum (inclusive of aluminum alloys), zinc or copper plate; a plastic film such as a cellulose diacetate, cellulose triacetate, cellulose propionate, cellulose butyrate, cellulose acetate butyrate, cellulose nitrate, polyethylene terephthalate, polyethylene, polystyrene, polypropylene, polycarbonate or polyvinyl acetal film; and paper or a plastic film listed above which is laminated with a metal foil or on which a layer of the foregoing metal is deposited. Particularly preferred is an aluminum plate because of its high dimensional stability and low cost. Further, it is also preferred to use a composite sheet comprising a polyethylene terephthalate film on which an aluminum sheet is bonded as disclosed in J. P. KOKOKU No. Sho 48-18327. The surface of the aluminum plate is preferably grained by, for instance, mechanical methods such as wire brush graining, brush graining which comprises graining with a nylon brush with pouring a slurry of abrasive particles, ball graining, graining through liquid honing and buff graining; chemical graining methods such as those in which HF, AlCl₃ or HCl is used as an etchant; electrolytic graining in which nitric acid or hydrochloric acid is used as an electrolyte; or combined graining comprising combinations thereof, then optionally etched with an acid or alkali and anodized in an electrolyte such as sulfuric acid, phosphoric acid, oxalic acid, boric acid, chromic acid, sulfamic acid or a mixture thereof using a DC or AC current to form a strong passivation film on the surface of the aluminum plate. Such a passivation film per se makes the aluminum plate surface hydrophilic, but it is particularly preferred that the aluminum plate is optionally hydrophilized by subjecting it to a silicate (sodium silicate, potassium silicate) treatment as disclosed in U.S. Pat. Nos. 2,714,066 and 3,181,461; a potassium fluorozirconate treatment as disclosed in U.S. Pat. No. 2,946,638; a phosphomolybdate treatment as disclosed in U.S. Pat. No. 3,201,247; an alkyl titanate treatment as disclosed in U.K. Patent No. 1, 108,559; a polyacrylic acid treatment as disclosed in German Patent No. 1,091,433; a polyvinyl phosphonic acid treatment as disclosed in German Patent No. 1,134,093 and U.K. Patent No. 1,230,447; a phosphonic acid treatment as disclosed in J. P. KOKOKU No. Sho 44-6409; a phytic acid treatment as disclosed in U.S. Pat. No. 3,307,951; a combined treatment with a hydrophilic organic polymeric compound and a bivalent metal as disclosed in J. P. KOKAI Nos. Sho 58-16893 and Sho 58-16291; a treatment by means of an underlying coating of an water-soluble polymer having sulfonate groups as disclosed in J. P. KOKAI No. Sho 59-101651. Examples of other hydrophilization treatments are silicate electrodeposition treatments as disclosed in U.S. Pat. No. 3,658,662.

It is also preferred to use an aluminum plate which is subjected to a sealing treatment after graining and anodization treatments. Such a sealing treatment can be performed by immersing the aluminum plate in hot water or a hot aqueous solution containing an inorganic or organic salt or by means of a steam bath.

ACTINIC RAYS OR RADIANT RAYS

Light sources for actinic rays or radiant rays used in the present invention are, for instance, a mercury lamp, a metal halide lamp, a xenon lamp, a chemical lamp and a carbon arc lamp for actinic rays and electron rays, X-rays, ion beam and far ultraviolet rays for radiant rays. Preferred examples of light sources are g-rays, i-rays and Deep-UV rays for photoresists. In addition, a scanning exposure technique with a high energy density beam such as laser beam or electron rays can be employed in the invention. Examples of such laser beam sources are an He.Ne laser, an Ar laser, a Kr ion laser, a He.Cd laser and KrF excimer laser.

DEVELOPER

Examples of developers for the positive working light-sensitive composition of the present invention preferably include an aqueous solution of an inorganic alkali agent such as sodium silicate, potassium silicate, sodium hydroxide, potassium hydroxide, lithium hydroxide, tertiary sodium phosphate, secondary sodium phosphate, tertiary ammonium phosphate, secondary ammonium phosphate, sodium metasilicate, sodium bicarbonate or ammonia or an organic alkali agent such as tetraalkyl ammonium hydroxide. These alkaline agents may be used alone or in combination. The concentration thereof ranges from 0.1 to 10% by weight and preferably 0.5 to 5% by weight.

These aqueous alkali solutions may optionally comprise a surfactant or an organic solvent such as an alcohol.

The present invention will hereunder be explained in more detail with reference to the following non-limitative working Examples and the effects practically achieved by the present invention will also be discussed in detail.

EXAMPLES 1 to 10

A 2S aluminum plate having a thickness of 0.24 mm was immersed in 10%, aqueous solution of tertiary sodium phosphate maintained at 80° C. for 3 minutes to degrease the same, grained with a nylon brush, etched with a sodium aluminate solution for about 10 minutes and the desmutted with a 3%, aqueous solution of sodium hydrogen sulfate. The aluminum plate was then anodized at a current density of 2 A/dm² for 2 minutes in a 20% sulfuric acid solution to thus obtain an aluminum substrate.

Ten kinds of solutions, (A)-1 to (A)-10, of light-sensitive composition (hereunder referred to as "light-sensitive solutions") were prepared by changing the kinds of (a) compounds capable of generating acids through irradiation of actinic rays or radiant rays and (b) organic bases used in a light-sensitive solution (A) having the following composition. Each of these light-sensitive solutions was applied onto the aluminum plate, which had been anodized, and dried at 100° C. for 2 minutes to obtain the corresponding PS plates (A)-1 to (A)-10. The coated amount of the light-sensitive solution was 1.5 g/m² (weighed after drying) in all the PS plates.

The compounds capable of generating acids through irradiation of actinic rays or radiant rays and the organic bases used in the light-sensitive solutions (A)-1 to (A)-10 are listed in Table I given below.

| Light-sensitive Solution (A) | |
|---|---|
| Component | Amount (g) |
| (a) Compound capable of generating acids through irradiation of actinic rays or radiant rays | 0.02 |
| (b) Organic base | 0.02 |
| Cresol/formaldehyde/novolak resin | 1.0 |
| Oil Blue #603 (available from ORIENT CHEMICAL INDUSTRIES CO., LTD.) | 0.01 |
| Methyl ethyl ketone | 5 |
| Methyl cellosolve | 15 |

TABLE I

| Ex. No. | PS plate | Compound (a) | Organic base (b) |
|---|---|---|---|
| 1 | (A)-1 | III-2 | VII-1 |
| 2 | (A)-2 | III-2 | XIV-1 |
| 3 | (A)-3 | III-2 | IX-7 |
| 4 | (A)-4 | III-2 | IX-8 |
| 5 | (A)-5 | III-2 | XIII-2 |
| 6 | (A)-6 | III-2 | X-1 |
| 7 | (A)-7 | III-2 | XII-1 |
| 8 | (A)-8 | IV-1 | VII-1 |
| 9 | (A)-9 | IV-1 | VII-1 |
| 10 | (A)-10 | I-2 | VII-1 |

A gray scale having density different of 0.15 was brought in close contact with the light-sensitive layer of each PS Plate (A)-1 to (A)-10 and the layer was exposed to light from a 2 KW high pressure mercury lamp at a distance of 50 cm for 2 minutes. The exposed PS plates (A)-1 to (A)-10 were immersed in and developed with DP-4 (trade name; available from Fuji Photo Film Co., ltd.) diluted 8 times with water for 60 seconds at 25° C. to thus obtain clear positive images.

EXAMPLES 11 TO 15

Five kinds of solutions, (B)-1 to (B)-5, of light-sensitive solutions were prepared by changing the kinds of (a) compounds capable of generating acids through irradiation of actinic rays or radiant rays and (b) organic bases used in a light-sensitive solution (B) having the following composition. Each of the light-sensitive solutions was applied onto a silicon wafer with a spinner and dried on a hot plate maintained at 90° C. for 2 minutes, The thickness of the layer was 1.0 μm.

| Light-sensitive Solution (B) | |
|---|---|
| Component | Amount (g) |
| (a) Compound capable of generating acids through irradiation of actinic rays | 0.03 |
| (b) Organic base | 0.03 |
| Cresol/formaldehyde/novolak resin | 1.0 |
| Perylene | 0.003 |
| Ethyl cellosolve acetate | 7.5 |

TABLE I

| Ex. No. | PS plate | Compound (a) | Organic base (b) |
|---|---|---|---|
| 11 | (B)-1 | III-2 | VII-1 |
| 12 | (B)-2 | III-2 | XIV-1 |
| 13 | (B)-3 | III-2 | IX-2 |
| 14 | (B)-4 | III-2 | X-1 |
| 15 | (B)-5 | III-2 | XII-1 |

Then the resultant resist layer was exposed to light with a scale down projection aligner (stepper) using monochromatic light of 436 nm and was developed with a 2.4% aqueous solution of tetramethyl ammonium hydroxide for 60 seconds to form a resist pattern. As a result, a good pattern having a line & space of 0.8 μm was obtained.

EXCAMPLE 16

The resulting resist layer from Example 11 was exposed to UV light of 254 nm through a glass mask with a close exposure method and then developed in the same manner as used in Example 11 and as a result, a good pattern having a line & space of 0.7 μm was obtained.

What is claimed is:

1. A positive working light-sensitive composition comprising an interactive combination of (a) a compound capable of generating acids through irradiation of actinic rays or radiant rays, (b) an organic base, and (c) an alkali-soluble polymer, said combination of components (a), (b) and (c) interacting upon exposure of at least a portion of the light-sensitive composition to actinic rays or radiant rays, to provide increased solubility of the light-sensitive composition in an aqueous alkaline developing solution, said organic base (b) selected from compounds represented by the following general formulae:

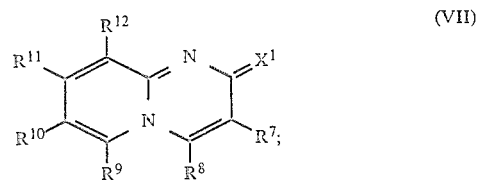

(VII)

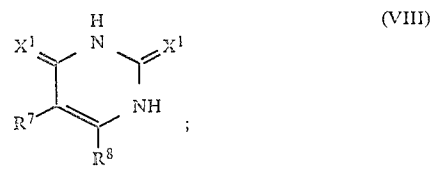

(VIII)

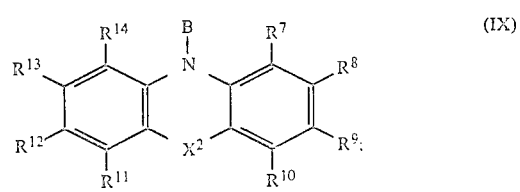

(IX)

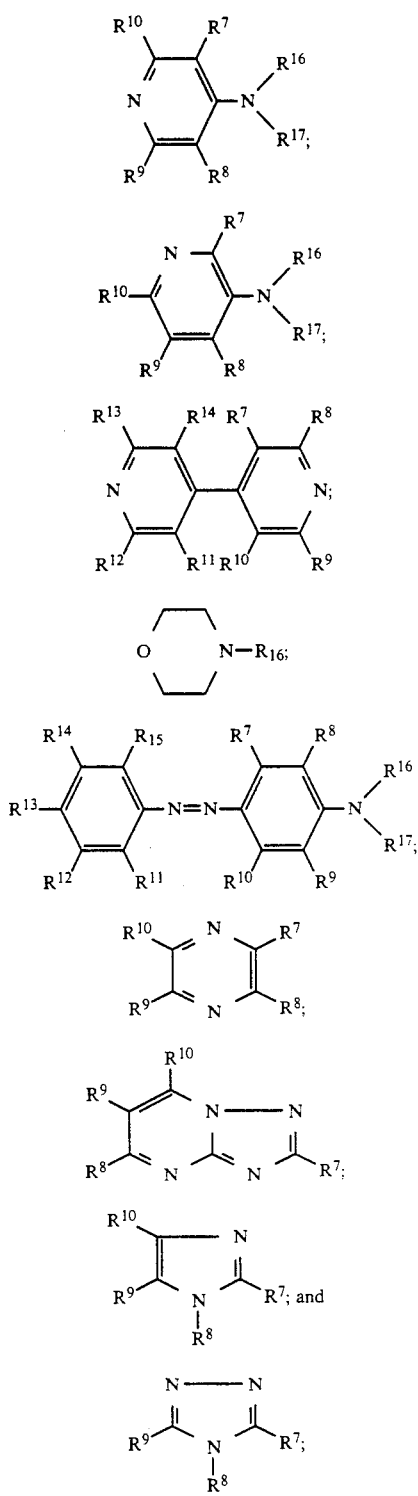

group; $X^1$ is an oxygen atom or a sulfur atom; $X^2$ is an oxygen atom, a sulfur atom, —C—O— or

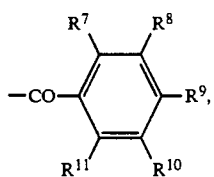

wherein $R^{18}$ represents a hydrogen atom, a substituted or unsubstituted alkyl group or a substituted or unsubstituted aryl group; and B is a hydrogen atom, a substituted or unsubstituted alkyl group, a substituted or unsubstituted aryl group or a group represented by the formula:

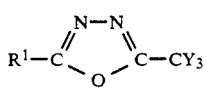

and said compound capable of generating acids through irradiation of actinic rays or radiant rays is selected from the group of oxadiazole compounds of formula (I), s-triazine compounds of formula (II), iodonium salts of formula (III), sulfonium salts of formula (IV), disulfone compounds of formula (V), and imidosulfonate compounds of formula (VI):

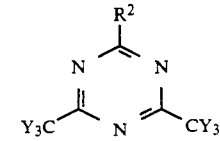 (I)

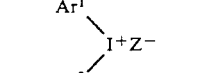 (II)

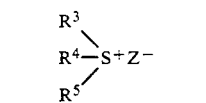 (III)

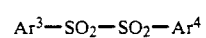 (IV)

$Ar^3$—$SO_2$—$SO_2$—$Ar^4$ (V)

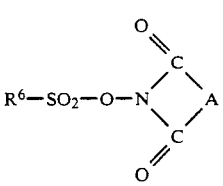 (VI)

wherein $R^7, R^8, R^9, R^{10}, R^{11}, R^{12}, R^{13}, R^{14}$ and $R^{15}$ may be the same or different, and each represents a hydrogen atom, a substituted or unsubstituted alkyl group, a substituted or unsubstituted aryl group, a substituted or unsubstituted alkoxy group, a halogen atom, a nitro group, a dialkylamino group or a diarylamino group; $R^{16}$ and $R^{17}$ may be the same or different, and each represents a hydrogen atom, a substituted or unsubstituted alkyl group or a substituted or unsubstituted aryl wherein $R^1$ represents a substituted or unsubstituted aryl group or a substituted or unsubstituted alkenyl group, $R^2$ represents a substituted or unsubstituted aryl group, a substituted or unsubstituted alkenyl group, —$CY_3$, or a substituted or unsubstituted alkyl group, Y represents a chlorine or bromine atom, $Ar^1$ and $Ar^2$ may be the same or different and each represents a substituted or unsubstituted aryl group, $R^3$, $R^4$ and $R^5$ may be the same or different and each represents a substituted or unsubstituted alkyl group or a substituted or unsubstituted aryl group, $Ar^3$ and $Ar^4$ may be the same or different and each represents a substituted or unsubstituted aryl group, $R^6$ represents a substituted or unsubstituted alkyl group or a substituted or unsubstituted aryl group, and A represents a substituted or unsubstituted alkylene group, a substituted or unsubstituted alkenylene group, or a substituted or unsubstituted arylene group.

2. A positive working light-sensitive composition of claim 1, wherein said compound capable of generating acids through irradiation of actinic rays or radiant rays is an oxadiazole compound of formula (I) or an S-triazine compound of formula (II):

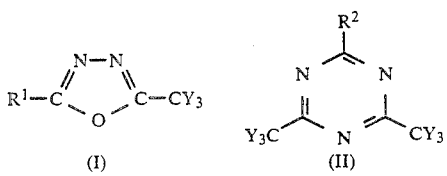

wherein $R^1$ represents a substituted or unsubstituted aryl group or a substituted or unsubstituted alkenyl group; $R^2$ represents a substituted or unsubstituted aryl group, a substituted or unsubstituted alkenyl group, $-CY_3$ or a substituted or unsubstituted alkyl group; and Y represents a chlorine or bromine atom.

3. A positive working light-sensitive composition of claim 1, wherein said compound capable of generating acids through irradiation of actinic rays or radiant rays is an iodonium salt of formula (III) or a sulfonium salt of formula (IV):

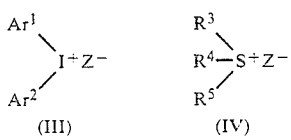

wherein, $Ar^1$ and $Ar^2$ may be same or different and each represents a substituted or unsubstituted aryl group; $R^3$, $R^4$ and $R^5$ may be same or different and each represents a substituted or unsubstituted alkyl group or a substituted or unsubstituted aryl group.

4. A positive working light-sensitive composition of claim 1, wherein said compound capable of generating acids through irradiation of actinic rays or radiant rays is a disulfone compound of formula (V) or an imidosulfonate compound of formula (VI):

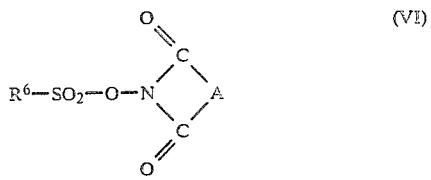

wherein $Ar^3$ and $Ar^4$ may be same or different and each represents a substituted or unsubstituted aryl group; $R^6$ represents a substituted or unsubstituted alkyl group or a substituted or unsubstituted aryl group ; and A represents a substituted or unsubstituted alkylene group, a substituted or unsubstituted alkenylene group or a substituted or unsubstituted arylene group.

5. A positive working light-sensitive composition of claim 1, wherein said compound capable of generating acids through irradiation of actinic rays or radiant rays is contained in the composition in an amount of 0.001 to 40% by weight based on the total weight of the solid content of the composition.

6. A positive working light-sensitive composition of claim 1, wherein said alkali-soluble polymer is a polymer carrying acidic group having a pKa value of not more than 11.

7. A positive working light-sensitive composition of claim 1, wherein said alkali-soluble polymer is contained in the composition in an amount of 10 to 90% by weight based on the total weight of the solid content of the composition.

8. A positive working light-sensitive composition of claim 1, wherein said composition comprises at least one member selected from the group consisting of dyes, pigments, plasticizers and compounds for enhancing photoreactivity or photoresponsibility and acid-generating efficiency of said compounds capable of generating acids through irradiation of actinic rays or radiant rays.

9. A positive working light-sensitive composition according to claim 1, said composition comprising about 0.1 to 50% by weight of said organic base, based on the total weight of the solid content of the composition.

* * * * *